(12) United States Patent
Miyamoto et al.

(10) Patent No.: US 11,747,408 B2
(45) Date of Patent: Sep. 5, 2023

(54) INTERFERENCE TYPE PHOTOMAGNETIC FIELD SENSOR DEVICE

(71) Applicants: CITIZEN FINEDEVICE CO., LTD., Yamanashi (JP); CITIZEN WATCH CO., LTD., Tokyo (JP); SHINSHU UNIVERSITY, Nagano (JP)

(72) Inventors: Mitsunori Miyamoto, Nagano (JP); Toshiya Kubo, Nagano (JP); Toshiroh Sato, Nagano (JP); Yuta Fujishiro, Nagano (JP); Makoto Sonehara, Nagano (JP)

(73) Assignees: CITIZEN FINEDEVICE CO., LTD., Yamanashi (JP); CITIZEN WATCH CO., LTD., Tokyo (JP); SIMSHU UNIVERSITY, Nagano (JP)

( * ) Notice: Subject to any disclaimer, the term of this patent is extended or adjusted under 35 U.S.C. 154(b) by 46 days.

(21) Appl. No.: 17/427,908

(22) PCT Filed: Aug. 29, 2019

(86) PCT No.: PCT/JP2019/034023
§ 371 (c)(1),
(2) Date: Aug. 2, 2021

(87) PCT Pub. No.: WO2020/161953
PCT Pub. Date: Aug. 13, 2020

(65) Prior Publication Data
US 2022/0107370 A1    Apr. 7, 2022

(30) Foreign Application Priority Data

Feb. 5, 2019    (JP) ................................. 2019-019134

(51) Int. Cl.
*G01R 33/032*    (2006.01)
*G02F 1/09*    (2006.01)

(52) U.S. Cl.
CPC ......... *G01R 33/0322* (2013.01); *G02F 1/092* (2013.01)

(58) Field of Classification Search
CPC .. G01R 33/0322; G01R 33/0029; G02F 1/092
(Continued)

(56) References Cited

U.S. PATENT DOCUMENTS 9,423,635 B1 *   8/2016 Cameron ................... G02F 1/09
2003/0133657 A1 *   7/2003 Kochergin ......... G01N 21/1717
                                                  385/12

(Continued)

FOREIGN PATENT DOCUMENTS

JP    2011-510328 A    3/2011
JP    2012053017 A    3/2012

(Continued)

OTHER PUBLICATIONS

Tamura et al., "Ring Interferometric Magnetic Field Optical Sensor Using a Garnet Single Crystal" Journal of the Magnetics Society of Japan [online], vol. 34, No. 4, pp. 537-542, Jul. 1, 2010 (Cited in International Search Report and Written Opinion for International Patent Application No. PCT/JP2019/034023.

(Continued)

*Primary Examiner* — Christopher P McAndrew (57) ABSTRACT

An interference type optical magnetic field sensor device 1 has a light emitter 10 emitting first linearly polarized light, a first optical element 30 emitting a first linearly polarized wave and a second linearly polarized wave orthogonal to the first linearly polarized wave with respect to incident first linearly polarized light, and emitting a second linearly polarized light with respect to incident third linearly polarized wave and a forth linearly polarized wave orthogonal to the third linearly polarized wave, a magnetic field sensor element 50 disposed at least a portion thereof within a (Continued)

predetermined magnetic field an optical path unit 40 connected to the first optical element and the magnetic field sensor element, and having a first optical path propagating the first linearly polarized wave and the forth linearly polarized wave, and a second optical path propagating the second linearly polarized wave and the third linearly polarized wave, a detection signal generator 60 outputting a detection signal by separating the second linearly polarized light into an S polarization component and a P polarization component, converting the S polarization component and the P polarization component into an electric signal, and an optical branching element 20 transmitting the first linearly polarized light to the first optical element, and branching the second linearly polarized light to the detection signal generator, wherein the magnetic field sensor element emits the first linearly polarized wave and the second linearly polarized wave as incident light, and emits the third linearly polarized wave with respect to the first linearly polarized wave and the forth linearly polarized wave with respect to the second linearly polarized wave as return light.

5 Claims, 9 Drawing Sheets

(58) Field of Classification Search
USPC .................................................. 324/244.1
See application file for complete search history.

(56) References Cited

U.S. PATENT DOCUMENTS

| 2009/0214125 | A1 | 8/2009 | Okumura | |
|---|---|---|---|---|
| 2009/0214152 | A1 | 8/2009 | Huang | |
| 2012/0001625 | A1* | 1/2012 | Yamada | G01R 33/032 |
| | | | | 324/244.1 |
| 2012/0113423 | A1 | 5/2012 | Groswasser | |
| 2013/0128330 | A1* | 5/2013 | Frankel | G02B 27/286 |
| | | | | 385/11 |
| 2014/0070802 | A1 | 3/2014 | Yamada et al. | |
| 2014/0225606 | A1* | 8/2014 | Endo | G01R 33/0322 |
| | | | | 324/260 |
| 2015/0288130 | A1* | 10/2015 | Izumi | G02F 1/092 |
| | | | | 359/484.02 |
| 2020/0348371 | A1* | 11/2020 | Ismaeel | G01R 33/0322 |
| 2022/0268818 | A1* | 8/2022 | Miyamoto | G01R 15/246 |

FOREIGN PATENT DOCUMENTS

| JP | 2018-146310 A | 9/2018 |
|---|---|---|
| WO | 2018/169165 A1 | 9/2018 |

OTHER PUBLICATIONS

Kamada et al., "Magnetic Field Sensors based on a Ring Interferometry", IEEE Transaction on Magnetics [online], vol. 35, Issue 5, p. 3628-3630, Sep. 1999 (Cited in International Search Report and Written Opinion for International Patent Application No. PCT/JP2019/034023.

Lee, Byoungho, "Review of the present status of optical fiber sensors", Optical Fiber Technology, [online], vol. 9, Issue 2, No. 4, p. 57-79, Apr. 2003 (Cited in International Search Report and Written Opinion for International Patent Application No. PCT/JP2019/034023.

Japan Patent Office, Office Action for Japanese Patent Application No. 2019-019134, dated Nov. 1, 2022.

EPO, Extended European Search Report for European Patent Application No. 19914589, dated Oct. 7, 2022.

\* cited by examiner

INTERFERENCE TYPE PHOTOMAGNETIC FIELD SENSOR DEVICE

TECHNICAL FIELD

The present invention relates to an interference type optical magnetic field sensor device.

BACKGROUND

An interference type optical magnetic field sensor device is known that uses a probe type sensor provided with a Faraday rotator at the optical fiber tip as a magnetic field sensor element, and generates a detection signal corresponding to the magnetic field applied to the Faraday rotator by photoelectric converting from light transmitted through the magnetic field sensor element ("Ring Interferometric Magnetic Field Optical Sensor Using a Garnet Single Crystal H. Tamura, et al. "Journal of the Magnetics Society of Japan Vol. 34, No. 4, 2010, referred to as "Non-Patent Document 1"). The interference type optical magnetic field sensor device described in Non-Patent Document 1 may measure magnetic field perpendicular to the magnetic field sensor element as well as magnetic field parallel to the magnetic field sensor element, by using a rare earth iron garnet crystal (TbY) IG as a Faraday rotator magnetic field sensor element.

SUMMARY

However, since the interference type optical magnetic field sensor device described in Non-Patent Document 1 generates a detection signal by photoelectric conversion directly from light transmitted through the magnetic field sensor element, the generated detection signal includes a large constant DC component regardless of the magnetic field applied to the Faraday rotator. The DC component included in the generated detection signal is a noise that does not contribute to the detection of the magnetic field applied to the Faraday rotator. The detection sensitivity of the interference type optical magnetic field sensor device described in Non-Patent Document 1 may be lowered, since the detection signal contains a large noise that does not contribute to the detection of the detected magnetic field, and therefore SN ratio of the detection signal is lowered.

The present disclosure is to solve such problems, and an object thereof is to provide an interference type optical magnetic field sensor device having a high SN ratio of the detection signal for detecting the magnetic field.

An interference type optical magnetic field sensor device has a light emitter emitting first linearly polarized light, a first optical element emitting a first linearly polarized wave and a second linearly polarized wave orthogonal to the first linearly polarized wave with respect to incident the first linearly polarized light, and emitting a second linearly polarized light with respect to incident third linearly polarized wave and a forth linearly polarized wave orthogonal to the third linearly polarized wave, a magnetic field sensor element disposed at least a portion thereof within a predetermined magnetic field, an optical path unit connected to the first optical element and the magnetic field sensor element, and having a first optical path propagating the first linearly polarized wave and the forth linearly polarized wave, and a second optical path propagating the second linearly polarized wave and the third linearly polarized wave, a detection signal generator outputting a detection signal by separating the second linearly polarized light into an S polarization component and a P polarization component, converting the S polarization component and the P polarization component into an electric signal, and an optical branching element transmitting the first linearly polarized light to the first optical element, and branching the second linearly polarized light to the detection signal generator, wherein the magnetic field sensor element emits the first linearly polarized wave and the second linearly polarized wave as incident light, and emits the third linearly polarized wave with respect to the first linearly polarized wave and the forth linearly polarized wave with respect to the second linearly polarized wave as return light.

It is preferable in the interference type optical magnetic field sensor device that the optical path unit further has a second optical element adjusts the phases of the second linearly polarized wave and the third linearly polarized wave so that the phase difference between the second linearly polarized wave and the third linearly polarized wave is 90 degrees.

It is preferable in the interference type optical magnetic field sensor device that the first optical element is a (½) wave plate disposed so as to have azimuth of 22.5 degrees respect to the polarization plane of the first linearly polarized light incident from the light emitter.

It is preferable in the interference type optical magnetic field sensor device that optical paths among the light emitter, the first optical element, the optical path unit, the magnetic field sensor element and the detection signal generator are connected by polarization maintaining fibers.

It is preferable in the interference type optical magnetic field sensor device that each of the polarization maintaining fibers is a PANDA fiber.

It is preferable in the interference type optical magnetic field sensor device that the first optical path and the second optical path have polarization maintaining fibers.

The interference type optical magnetic field sensor device according to the present disclosure may increase the SN ratio of the detection signal for detecting the magnetic field, since the linearly polarized light having polarized plane rotating 45 degrees is separated into an S polarization component and a P polarization component, and a detection signal is generated by receiving the S and P polarization components.

DESCRIPTION OF EMBODIMENTS

A preferable embodiment of a interference type optical magnetic field sensor device according to the disclosure will be described with reference to attached drawings. Note that the technical scope of the disclosure is not limited to such an embodiment but covers the invention and its equivalents, as set forth in the appended claims.

(Configuration and Function of an Interference Type Optical Magnetic Field Sensor Device According to the Embodiment)

Figure 1:
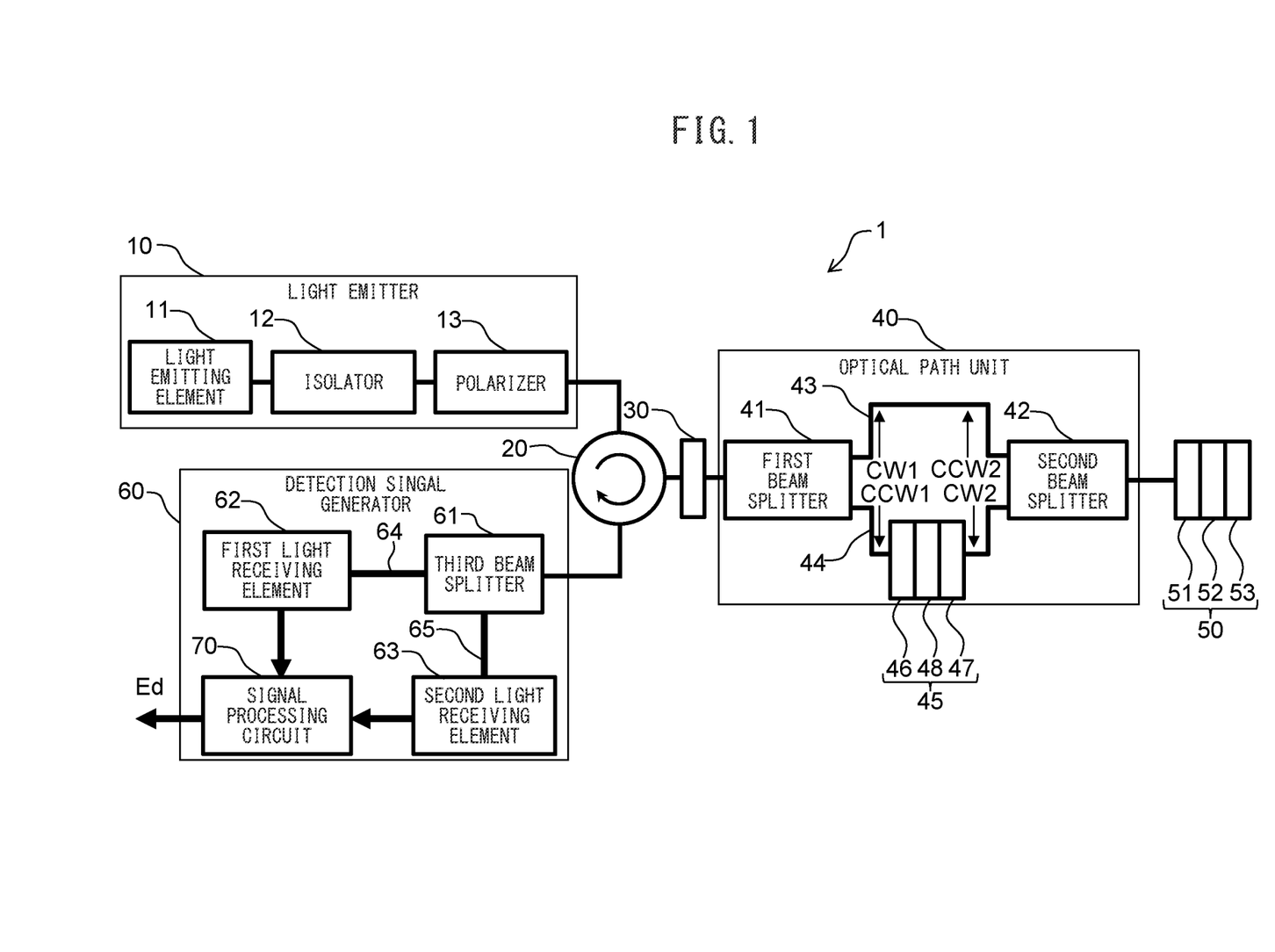
FIG. 1 is a block diagram showing an interference type optical magnetic field sensor device according to an embodiment.

FIG. 1 is a block diagram showing an interference type optical magnetic field sensor device according to an embodiment.

An interference type optical magnetic field sensor device 1 has a light emitter 10, a circulator 20, a first optical element 30, an optical path unit 40, a magnetic field sensor element 50 and a detection signal generator 60. The optical paths among the light emitter 10, the circulator 20, the first optical element 30, the optical path unit 40, the magnetic field sensor element 50 and the detection signal generator 60 are connected by PANDA (Polarization-maintaining and Absorption-reducing) fibers. The optical paths among the light emitter 10, the circulator 20, the first optical element 30, the optical path unit 40, the magnetic field sensor element 50 and the detection signal generator 60 may be connected by polarization maintaining fibers such as bow-tie fibers, elliptical jacket fibers and etc.

The light emitter 10 has a light emitting element 11, an isolator 12 and a polarizer 13. For example, the light emitting element 11 is a semiconductor laser or a light emitting diode. In particular, a Fabry-Perot laser, superluminescent diode and etc. are preferably used as the light emitting element 11.

The isolator 12 transmits the light incident from the light emitting element 11 to the circulator 20, and protect the light emitting element 11 without transmitting the light incident from the circulator 20 to the light emitting element 11. For example, the isolator 12 is a polarization-dependent optical isolator, and may be a polarization-independent optical isolator.

The polarizer 13 is an optical element for polarizing the light emitted by the light emitting element 11 to linearly polarized light, and the types thereof are not limited. A first linearly polarized light obtained by the polarizer 13 is incident to the first optical element 30 through the circulator 20.

The circulator 20 is an optical branching element that transmits the first linearly polarized light emitted from the light emitter 10 to the first optical element 30, branches a second linearly polarized light emitted from the first optical element 30 to the detection signal generator 60. For example, the circulator 20 may be formed by a Faraday rotator, a (½) wave plate, a polarized beam splitter and reflective mirror.

For example, the first optical element 30 is a (½) wave plate disposed so as to have azimuth of 22.5 degrees respect to the polarization plane of the first linearly polarized light incident from the circulator 20, rotates the polarization plane of the first linearly polarized light incident from the circulator 20 45 degrees, and emits the first linearly polarized light to the optical path unit 40. The first linearly polarized light having polarization plane rotated by 45 degrees by the first optical element 30 has a first linearly polarized wave CW1 which is P polarized light, and a second linearly polarized wave CCW1 which is S polarized light orthogonal to the first linearly polarized wave CW1.

Further, the first optical element 30 rotates the polarization plane of the second linearly polarized light that is linearly polarized light incident from the optical path unit 40 45 degrees, and emits the second linearly polarized light to the circulator 20.

Optical path 40 has a first beam splitter 41, a second beam splitter 42, a first optical path 43, a second optical path 44 and a second optical element 45.

The first beam splitter 41 emits a first linearly polarized wave CW1 to the first optical path 43, and emits a second linearly polarized wave CCW1 to the second optical path 44. The third linearly polarized wave CW2 is incident from the second optical path 44 to the first beam splitter 41, and the fourth linearly polarized wave CCW2 is incident from the first optical path 43 to the first beam splitter 41. The third linearly polarized wave CW2 and the fourth linearly polarized wave CCW2 is a polarization component orthogonal to each other of the second linearly polarized light emitted to the first optical element 30.

The first linearly polarized wave CW1 is incident from the first optical path 43 to the second beam splitter 42, and the second linearly polarized wave CCW1 is incident from the second optical path 44 to the second beam splitter 42. Further, the second beam splitter 42 emits a third linearly polarized wave CW2 to the second optical path 44, and emits a fourth linearly polarized wave CCW2 to the first optical path 43.

The first beam splitter 41 and the second beam splitter 42 separates the incident light into a P polarization component and an S polarization component, and emits the multiplexed P and S polarization components. For example, each of the first beam splitter 41 and the second beam splitter 42 is a prism-type beam splitter, may be a planar beam splitter or a wedge-type beam splitter.

The first optical path 43 propagates and derives the first linearly polarized wave CW1 introduced from the first beam splitter 41 to the second beam splitter 42, and propagates and derives a fourth linearly polarized wave CCW2 introduced from the second beam splitter 42 to the first beam splitter 41. The second optical path 44 propagates and derives the second linearly polarized wave CCW2 introduced from the first beam splitter 41 to the second beam splitter 42, and propagates and derives a third linearly polarized wave CW2 introduced from the second beam splitter 42 to the first beam splitter 41.

The first optical path 43 is a PANDA fiber having one end optically connected to the first beam splitter 41, and the other end optically connected to the second beam splitter 42. The second optical path 44 is a PANDA fiber having one end optically connected to the first beam splitter 41 and the other end optically connected to the second beam splitter 42. The first optical path 43 and the second optical path 44 may be a polarization maintaining fiber such as a bow-tie fiber, an elliptical jacket fiber and etc.

The second optical element 45 is disposed on the second optical path 44.

The second optical element 45 has a first (¼) wave plate 46, a second (¼) wave plate 47 and a 45 degree Faraday rotator 48.

The first (¼) wave plate 46 is a (¼) wave plate having optical axis disposed so as to incline 45 degrees with respect to the slow axis and the phase advance axis of PANDA fibers forming the second optical path 44. The first (¼) wave plate 46 converts linearly polarized light into circularly polarized light, and converts circularly polarized light into linearly polarized light.

The second (¼) wave plate 47 is a (¼) wave plate having an optical axis disposed so as to incline −45 degrees with respect to the slow axis and the phase advance axis of PANDA fibers forming the second optical path 44. The second (¼) wave plate 47 converts the circularly polarized light emitted from the 45 degree Faraday rotator 48 into linearly polarized light, and converts the linearly polarized light into circularly polarized light.

The 45 degrees Faraday rotator 48 is a Faraday rotator for shifting the phase of the circularly polarized light incident from each of the first (¼) wave plate 46 and the second (¼) wave plate 47.

The 45 degree Faraday rotator 48 adjusts the phase of the circularly polarized light incident from the first (¼) wave plate 46 so that the phase of the second linearly polarized wave CCW1 emitted from the second (¼) wave plate 47 is shifted 45 from the phase of the second linearly polarized wave CCW1 which is linearly polarized light incident on the first (¼) wave plate 46. Further, the 45 degree Faraday rotator 48 adjusts the phase of the circularly polarized light, so that the phase of the third linearly polarized wave CW2 emitted from the first (¼) wave plate 46 is −45 shifted from the phase of the third linearly polarized wave CW2 incident on the second (¼) wave plate 46.

The magnetic field sensor element 50 has a (¼) wave plate 51, a Faraday rotator 52 and a mirror element 53, and is connected to the second beam splitter 42 through PANDA fibers, and at least a portion thereof may be disposed within a predetermined magnetic field. The magnetic field sensor element 50 is incident linearly polarized light emitted from the light emitter 10 as incident light, and emits a return light corresponding to the incident light incident.

The detection signal generator 60 includes a third beam splitter 61, a first light receiving element 62, a second light receiving element 63 and a signal processing circuit 70, and receives the second linearly polarized light branched by the circulator 20. The detection signal generator 60 outputs a detection signal Ed corresponding to the magnetic field applied to the magnetic field sensor element, by separating the second linearly polarized light into an S polarization component and a P polarization component, receiving the S and P polarization components, converting the S and P polarization components into an electric signal, and differential amplifying the electric signal. The third beam splitter 61 is a polarizing beam splitter (PBS) such as a prism type, a plane type, a wedge substrate type, an optical waveguide type and etc., and separates the second linearly polarized light branched by the circulator 20 into an S polarization component 64 and a P polarization component 65.

For example, each of the first light receiving element 62 and the second light receiving element 63 is a PIN photodiode. The first light receiving element 62 receives the S polarization component 64, and the second light receiving element 63 receives the P polarization component 65. Each of the first and second light receiving elements 62 and 63 photoelectrically converts the received light, and outputs an electrical signal corresponding to the light amount of the received light. The signal processing circuit 70 outputs a detection signal Ed corresponding to the magnetic field applied to the magnetic field sensor element, by differentially amplifying the electrical signals indicating the P and S polarization components.

Figure 2:
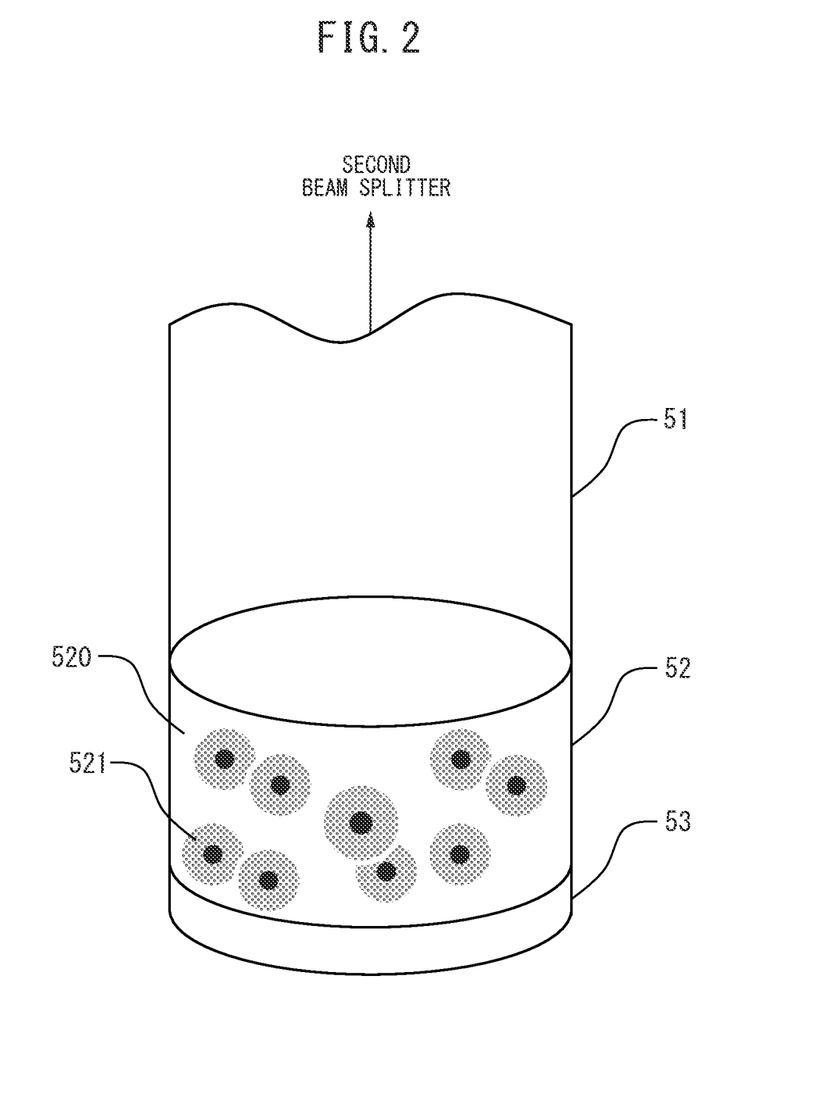
FIG. 2 is a schematic diagram of the magnetic field sensor element shown in FIG. 1.

FIG. 2 is a schematic diagram of the magnetic field sensor element 50.

The (¼) wave plate 51 is a (¼) wave plate that is disposed so that an optical axis thereof is inclined 45 degrees with respect to the slow axis and the phase advance axis of a PANDA fiber optically connected to the second beam splitter 42. The (¼) wave plate 51 converts from the polarization state of the incident light that is a linearly polarized light to circularly polarized light, and converts from the polarization state of the return light emitted from light the Faraday rotator 52 that is a circularly polarized light to linearly polarized light.

The Faraday rotator 52 is a granular film having a dielectric 520 and nano-order magnetic particles 521 dispersed in the dielectric 520 in a stably phase separation from the dielectric 520, and is disposed on the end face of the (¼) wave plate 51. Although oxide may be formed by the magnetic particles 521, for example, in a small portion of the outermost layer and etc., the magnetic particles 521 are dispersed alone in a thin film in the entire Faraday rotator 52 without making compounds with dielectric used as a binder. The distribution of the magnetic particles 521 in the Faraday rotator 52 may not be completely uniform, may be eccentrically located a little. If the dielectric 520 has high transparency and the magnetic particles 521 in the dielectric 520 has a size smaller than the wavelength of light, the Faraday rotator 52 has an optical transparency.

The faraday rotator 52 is not limited to a single layer, it may be a multilayer film in which the granular films and the dielectric films are alternately laminated. When the Faraday rotator 52 is formed by multi-layered granular films, multiple reflections are occurred in the granular films, and therefore a larger Faraday rotation angle is obtained.

The dielectric 520 is preferably fluoride (metallic fluoride) such as magnesium fluoride ($MgF_2$), aluminum fluoride ($AlF_3$), yttrium fluoride ($YF_3$) and etc. Further, the dielectric 520 may be an oxide such as tantalum oxide ($Ta_2O$), silicon dioxide ($SiO_2$), titanium dioxide ($TiO_2$), niobium pentoxide ($Nb_2O_5$), zirconium dioxide ($ZrO_2$), hafnium dioxide ($HfO_2$), aluminum trioxide ($Al_2O_3$), and etc. It is preferable that the dielectric 520 is formed by fluoride rather than oxide for good phase separation among the dielectric 520 and the magnetic particles 521, and it is more preferable that the dielectric 520 is formed by magnesium fluoride having a high transmittance.

The magnetic particle 521 may be formed by materials producing a Faraday effect, and is not limited, the magnetic particle 521 may be formed by ferromagnetic metals such as iron (Fe), cobalt (Co) and nickel (Ni) and alloys thereof. The examples of alloys of Fe, Co and Ni are for example, FeNi alloy, FeCo alloy, FeNiCo alloy and NiCo alloy. The Faraday rotation angle per unit length of Fe, Co and Ni is nearly two to three orders of magnitude larger than that of magnetic garnet applied to conventional Faraday rotators.

The mirror element 53 is formed on the Faraday rotator 52, and reflects the light transmitted through the Faraday rotator 52 to the Faraday rotator 52. For example, the mirror element 53 may be formed by silver (Ag) film, gold (Au) film, aluminum (Al) film, a dielectric multilayer film mirror and etc. An Ag film having high reflectivity and an Au film having high corrosion resistance are convenient for film formation and are preferable. The mirror element 53 may have any thickness that secures a sufficient reflective index of 98% or more, and for example, when the mirror element 53 is formed by an Ag film, it is preferable that the thickness is 50 nm or more and 200 nm or less. The Faraday rotation angle may be increased by reciprocating light in the Faraday rotator 52 using the mirror element 53.

Circularly polarized light incident on the Faraday rotator 52 emitted from the (¼) wave plate 51 is transmitted through the Faraday rotator 52, is reflected by the mirror element 53, is transmitted through the Faraday rotator 52 and becomes return light. The return light transmitted through the Faraday rotator 52 is incident on the (¼) wave plate 51.

Circularly polarized light incident on the Faraday rotator 52 from the (¼) wave plate 51 shifts the phase in response to the magnetic field applied to the Faraday rotator 52. Further, circularly polarized light reflected by the mirror element 53 shifts the phase in response to the magnetic field applied to the Faraday rotator 52.

Figure 3:
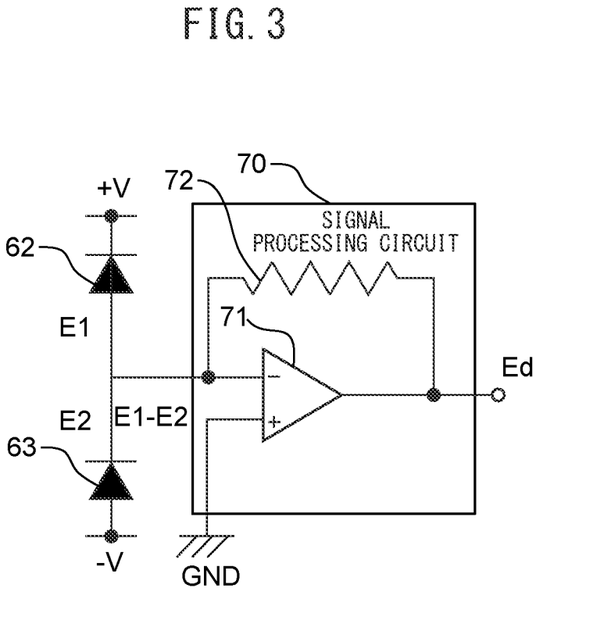
FIG. 3 is a circuit block diagram of a first light receiving element, a second light receiving element and a signal processing circuit in FIG. 1.

FIG. 3 is a circuit block diagram of a first light receiving element 62, a second light receiving element 63 and a signal processing circuit 70.

The signal processing circuit 70 has an amplifying element 71 such as an operational amplifier and a resistor 72. The cathode of the first light receiving element 62 and the anode of the second light receiving element 63 are connected to the negative input terminal of the amplifying element 71, the cathode of the first light receiving element 62 is connected to the positive power supply+V, and the anode of the second light receiving element 63 is connected to the negative power supply −V.

The first light receiving element 62 outputs a first electrical signal E1 that is a current proportional to the optical intensity of the S polarization component of the multiplexing of the third linearly polarized light and the fourth linearly polarized light. The second light receiving element 63 outputs a second electric signal E2 that is a current proportional to the optical intensity of the P polarization component of the multiplexing of the third linearly polarized light and the fourth linearly polarized light. The differential signal (E1-E2) between the first electric signal proportional to the optical intensity of the S polarization component and the second electric signal proportional to the optical intensity of the P polarization component is input to the negative input terminal of the amplifying element 71.

An S polarization component P0 of the light multiplexing the third and fourth linearly polarized lights and a P polarization component P90 of the light multiplexing the third and fourth linearly polarized lights are represented by the following Expressions (1) and (2).

$$P_0 = |E_{CW,0} + E_{CCW,0}|^2 \propto \sin^2(2\theta_F + 45°) \quad (1)$$

$$P_{90} = |E_{CW,90} + E_{CCW,90}|^2 \propto \cos^2(2\theta_F + 45°) \quad (2)$$

ECW, 0 is an S polarization component of the third linearly polarized light incident on the detection signal generator, and ECCW, 0 is an S polarization component of the fourth linearly polarized light incident on the detection signal generator. Further, ECW, 90 is a P polarization component of the third linearly polarized light incident on the detection signal generator, and ECCW, 90 is a P polarization component of the fourth linearly polarized light incident on the detection signal generator. Further, $\theta_F$ is a Faraday rotation angle corresponding to the magnetic field applied to the Faraday rotator 52.

The differential signal (E1-E2) inputted to the negative input terminal of the amplifier element 71 is proportional to the difference between the S polarization components P0 and P polarization component P90 of the multiplexing wave of the third and fourth linearly polarized lights, and is an electric signal corresponding to the Faraday rotation angle $\theta_F$.

The signal processing circuit 70 is an inverting amplifier circuit, and inverts and amplifies the differential signal (E1-E2) input to the negative input terminal of the amplifier element 71, and outputs the detection signal Ed. The detection signal Ed is an electrical signal removing DC component corresponding to the reference optical intensity.

(Operation of the Interference Type Optical Magnetic Field Sensor Device According to the Embodiment)

Figure 4:
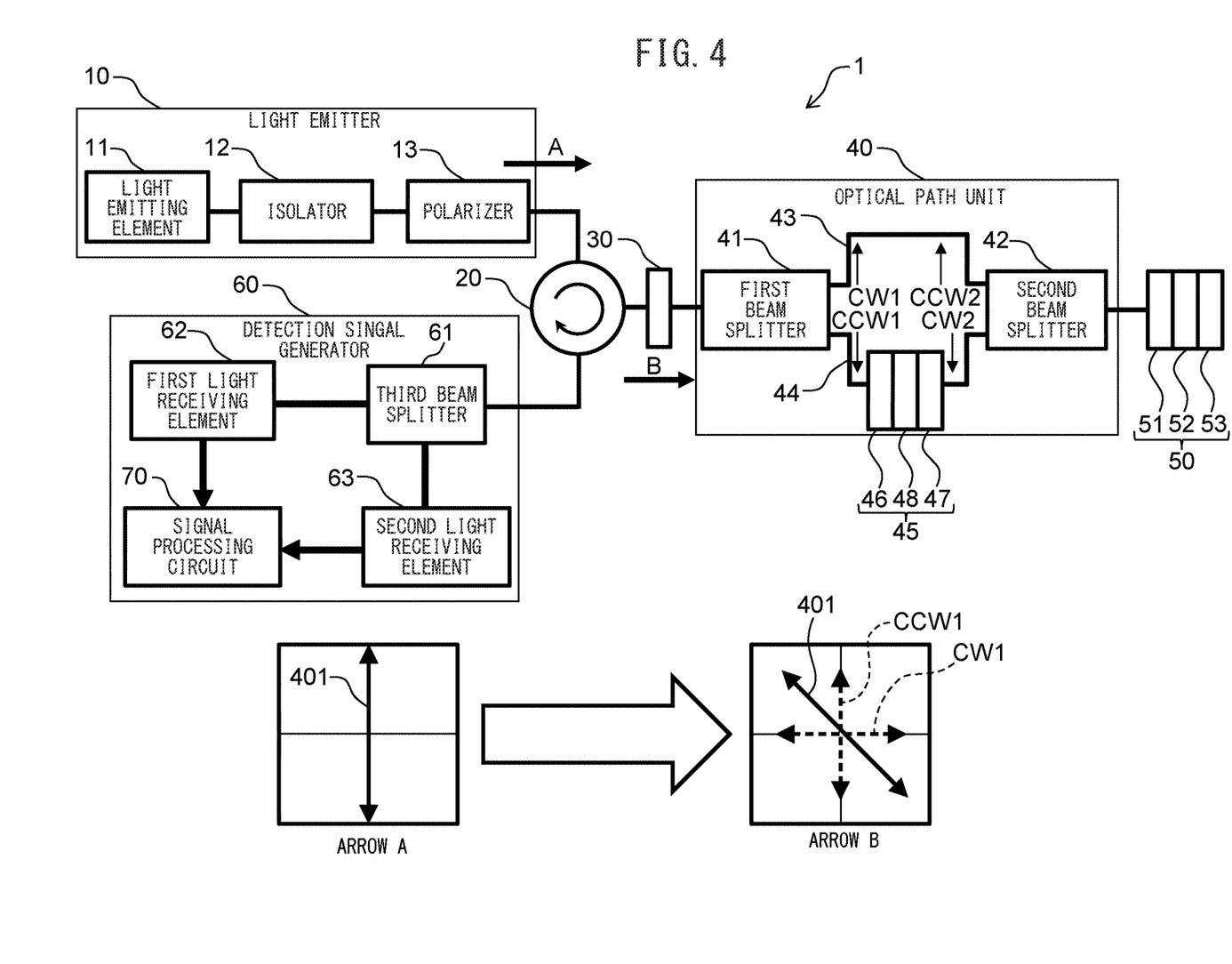
FIG. 4 is a diagram showing the operation of the interference type optical magnetic field sensor device shown in FIG. 1 (part 1)
Figure 5:
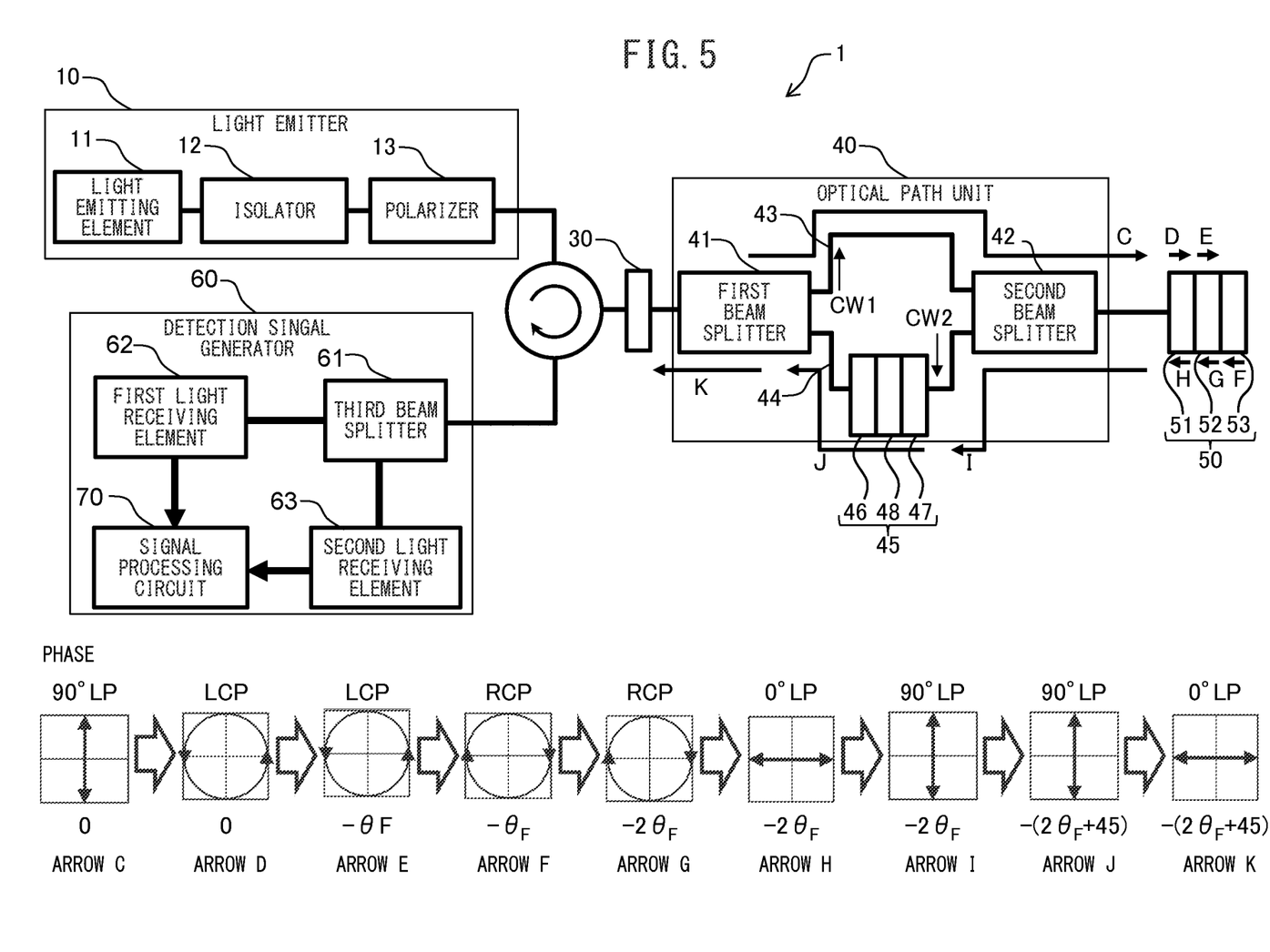
FIG. 5 is a diagram showing the operation of the interference type optical magnetic field sensor device shown in FIG. 1 (part 2)
Figure 6:
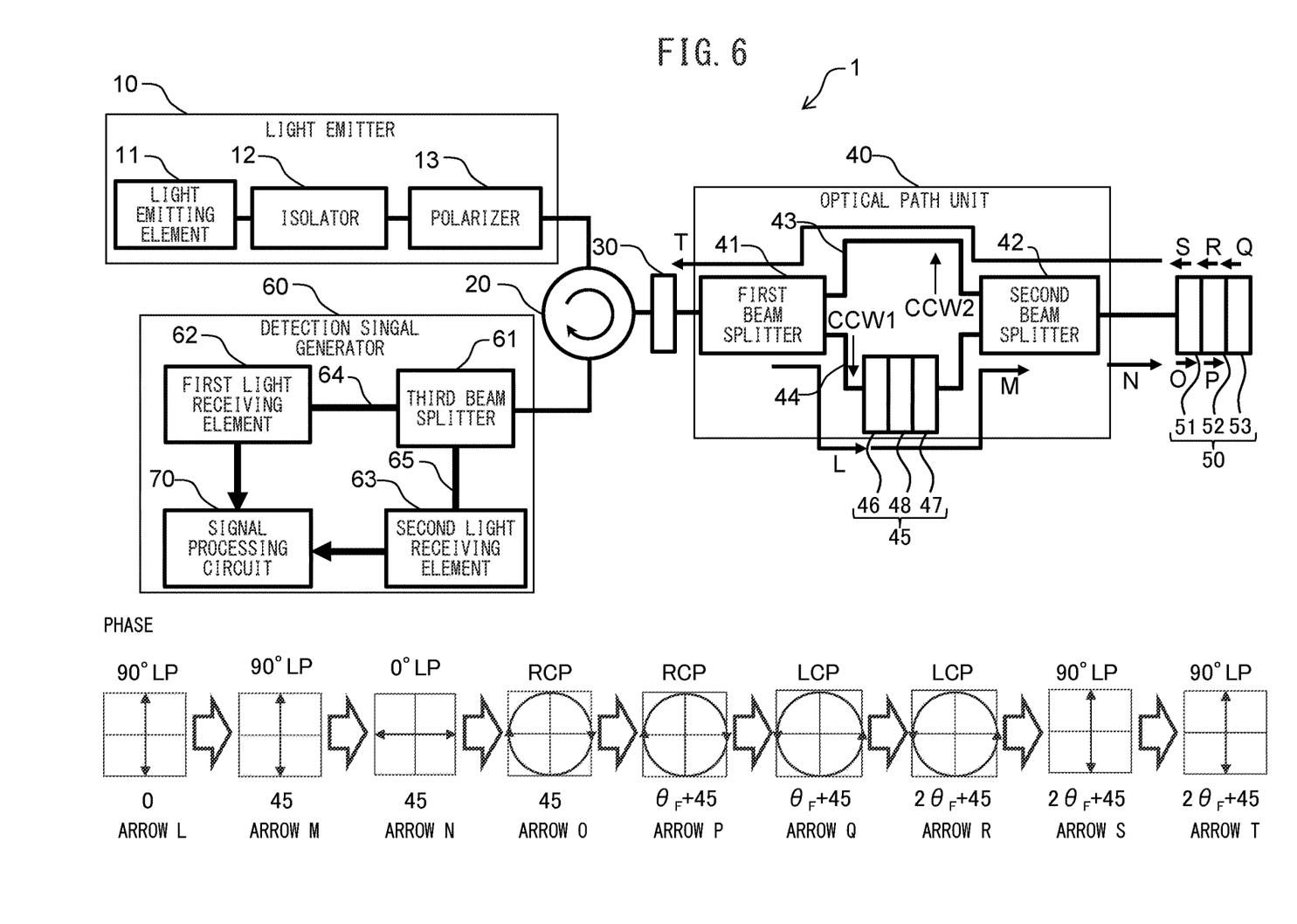
FIG. 6 is a diagram showing the operation of the interference type optical magnetic field sensor device shown in FIG. 1 (part 3)
Figure 7:
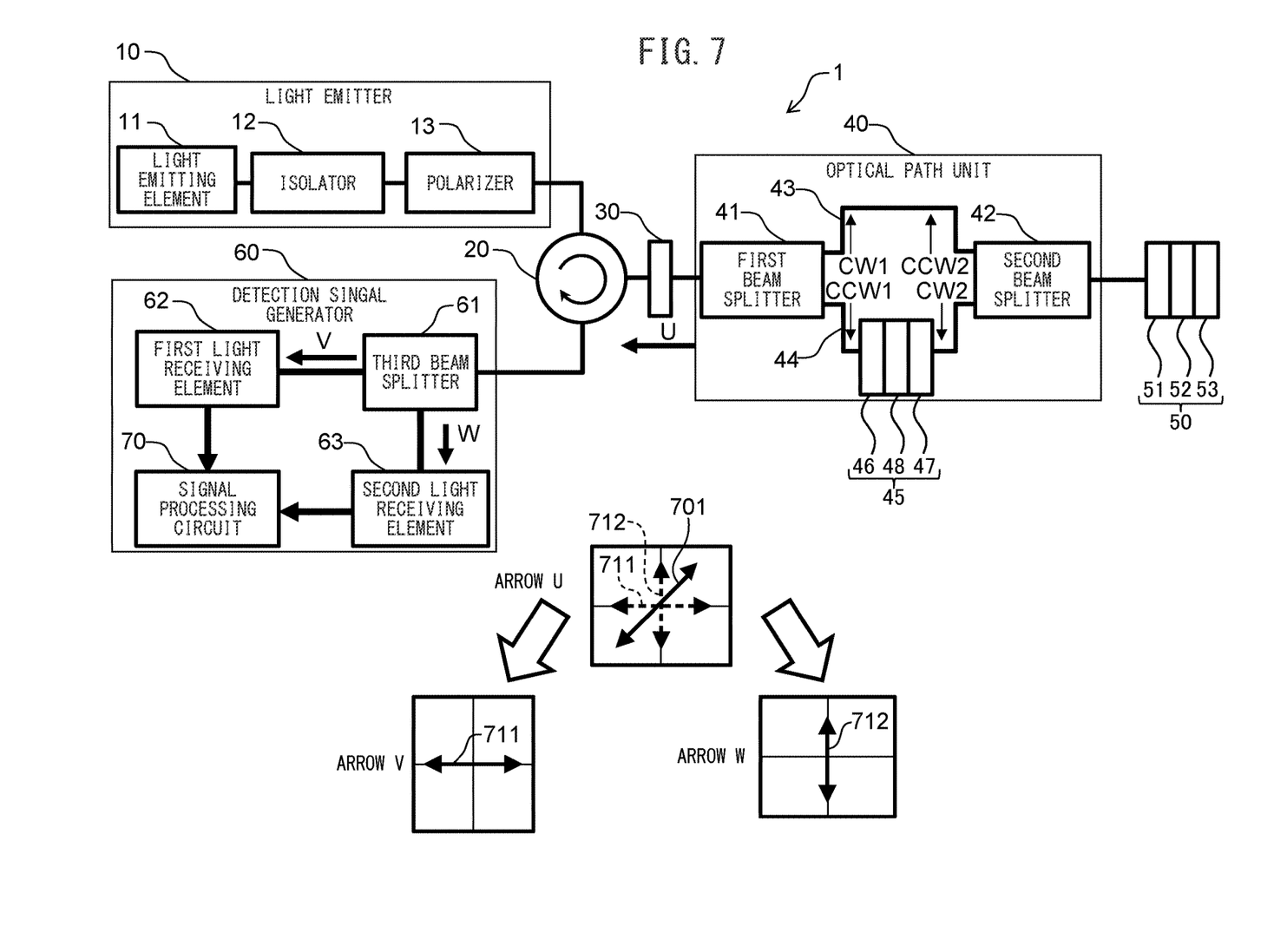
FIG. 7 is a diagram showing the operation of the interference type optical magnetic field sensor device shown in FIG. 1 (part 4)

FIG. 4 is a diagram showing the operation of the interference type optical magnetic field sensor device (part 1), FIG. 5 is a diagram showing the operation of the interference type optical magnetic field sensor device (part 2), FIG. 6 is a diagram showing the operation of the interference type optical magnetic field sensor device (part 3). FIG. 7 is a diagram showing the operation of the interference type optical magnetic field sensor device (part 4). FIG. 4 shows the operations of the polarizer 13 and the first optical element 30. FIG. 5 shows the operations of the optical path unit 40 and the magnetic field sensor element 50 when the first linearly polarized wave CW1 and the third linearly polarized wave CW2 is transmitted. FIG. 6 shows the operation of the optical path unit 40 and the magnetic field sensor element 50 when the second linearly polarized wave CCW1 and the fourth linearly polarized wave CCW2 is transmitted. FIG. 7 shows the operation of the first optical element 30 and the detection signal generator 60 when the first optical element 30 is transmitted.

As shown by arrow A in FIG. 4, linearly polarized light 401 which is P polarized light is emitted from the polarizer 13 through the circulator 20. Next, as shown by arrow B in FIG. 4, the linearly polarized light 401 emitted from the polarizer 13 rotates the polarization plane of the linearly polarized 401 light incident from the circulator 20 45 degrees, by transmitting through the first optical element 30. The linearly polarized 401 light having polarization plane rotated 45 degrees has a first linearly polarized wave CW1 and a second linearly polarized wave CCW1.

Next, as shown by the arrow C in FIG. 5, the first linearly polarized wave CW1 emitted from the first optical element 30 is incident on the magnetic field sensor element 50 through the first beam splitter 41, the first optical path 43 and the second beam splitter 42. Next, as shown by the arrow D in FIG. 5, the polarization state of the first linearly polarized wave CW1 incident on the magnetic field sensor element 50 is converted from linearly polarized light to the left-rotated circularly polarized light, by transmitting through the (¼) wave plate 51. Next, as shown by the arrow E in FIG. 5, circularly polarized light transmitted through the (¼) wave plate 51 shifts the phase −$\theta_F$ in response to the magnetic field applied to the Faraday rotator 52, by transmitting through the Faraday rotator 52.

Next, as shown by the arrow F in FIG. 5, the left rotated circularly polarized light emitted from the Faraday rotator 52 becomes a right rotated circularly polarized light, by reflected by the mirror element 53. Next, as shown by the arrow G in FIG. 5, the phase of the circularly polarized light reflected by the mirror element 53 further shifts −$\theta_F$ in response to the magnetic field applied to the Faraday rotator 52 and therefore shift $-2\theta_F$ in total, by transmitting through the Faraday rotator 52. Next, as shown by the arrow H in FIG. 5, the polarization state of the return light transmitted through the Faraday rotator 52 is converted from the right rotated circularly polarized wave to the third linearly polarized wave CW2 that is S polarized light, by transmitting through the (¼) wave plate 51.

Next, as shown by the arrow I in FIG. 5, the polarization state of the third linearly polarized wave CW2 incident on the second beam splitter 42 is converted from S polarized light to P polarized light, by transmitting the second beam splitter 42. Next, as shown by the arrow J in FIG. 5, the third linearly polarized wave CW2 transmitted through the second optical element 45 shifts the phase −45 degrees. Next, as shown by the arrow K in FIG. 5, the polarization state of the third linearly polarized wave CW2 incident on the first beam splitter 41 is converted from P polarized light to S polarized light, by transmitting the first beam splitter 41.

As shown by the arrow L in FIG. 6, the second linearly polarized wave CCW1 emitted from the first optical element 30 is emitted to the second optical path 44 through the first beam splitter 41. The polarization state of the second linearly polarized wave CCW1 is converted from S polarized light to P polarized light by transmitting through the first beam splitter 41. Next, as shown by the arrow M in FIG. 6, the second linearly polarized wave CCW1 transmitted through the second optical element 45 shifts the phase 45 degrees. Next, as shown by the arrow N in FIG. 6, the polarization state of the second linearly polarized wave CCW1 incident on the second beam splitter 42 is converted from P polarized light to S polarized light, by transmitting the second beam splitter 42.

Next, as shown by the arrow O in FIG. 6, the polarization state of the second linearly polarized wave CCW1 incident on the magnetic field sensor element 50 is converted from a linearly polarized wave to a right rotated circularly polarized wave, by transmitting through the (¼) wave plate 51. Next, as shown by the arrow P in FIG. 6, the phase of circularly polarized light transmitted through the (¼) wave plate 51 shifts $\theta_F$ in response to the magnetic field applied to the Faraday rotator 52, by transmitting through the Faraday rotator 52.

Next, as shown by the arrow Q in FIG. 6, circularly polarized light emitted from the Faraday rotator 52 becomes a left rotated circularly polarized light, by reflected by the mirror element 53. Next, as shown by the arrow R in FIG. 6, the phase of the circularly polarized light reflected by the mirror element 53 further shifts $\theta_F$ in response to the magnetic field applied to the Faraday rotator 52, and therefore shifts $2\theta_F$ in total, by transmitting the Faraday rotator 52. Next, as shown by the arrow S in FIG. 6, the polarization state of the return light transmitted through the Faraday rotator 52 is converted from the left rotated circularly polarized wave to the fourth linearly polarized wave CCW2 which is P polarized light, by transmitting through the (¼) wave plate 51. Next, the fourth linearly polarized wave CCW2 emitted from the magnetic field sensor element 50 is incident on the first beam splitter 41 through the second beam splitter 42 and the first optical path 43, and is multiplexed with the third linearly polarized wave CW2.

Next, as shown by the arrow U in FIG. 7, the polarization plane of the multiplexing wave 701 of the third linearly polarized wave CW2 and the fourth linearly polarized wave CCW2 multiplexed by the first beam splitter 41 is rotated 45 degrees, by transmitting the first optical element 30. Then, as shown by the arrow V in FIG. 7, an S polarization component 711 of the multiplexing wave 701 of the third linearly polarized wave CW2 and the fourth linearly polarized wave CCW2 is incident on the first light receiving element 62 through the third beam splitter 61. Further, as shown by the arrow W in FIG. 7, a P polarization component 712 of the multiplexing wave 701 of the third linearly polarized wave CW2 and the fourth linearly polarized wave CCW2 is incident on the second light receiving element 63 through the third beam splitter 61.

(Effect of the interference type optical magnetic field sensor device according to the embodiment) In the interference type optical magnetic field sensor device 1, since the differential signal (E1-E2) between the first electric signal proportional to the optical intensity of the S polarization component and the second electric signal proportional to the optical intensity of the P polarization component is inverted and amplified to generate a detection signal Ed, the DC component corresponding to the reference optical intensity is removed from the detection signal. In the interference type optical magnetic field sensor device 1, since DC component corresponding to the reference optical intensity is removed from the detection signal, the SN ratio of the detection signal corresponding to the detected magnetic field may be increased.

Figure 8A:
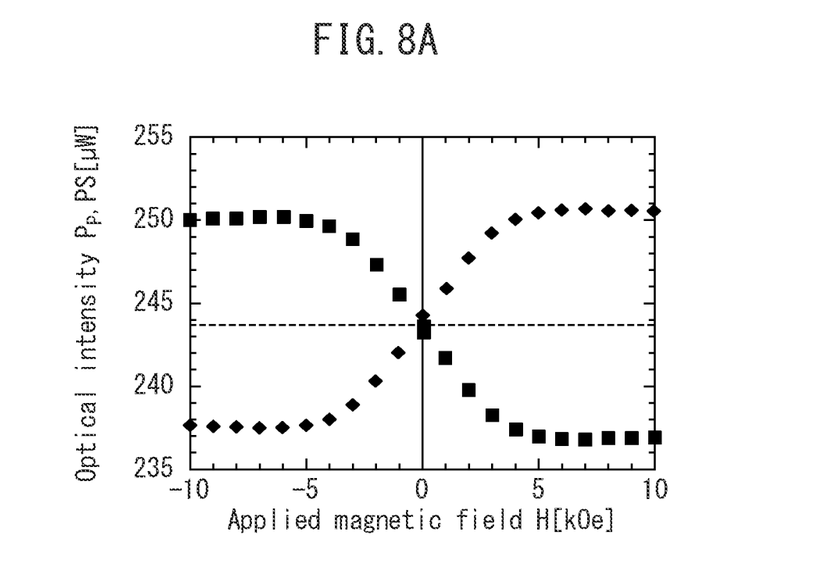
FIG. 8A is a diagram showing an exemplary relationship between the magnetic field applied to the Faraday rotator shown in FIG. 1 and the optical intensities of the S and P polarization components of the multiplexing wave of the third linearly polarized wave CW2 and the fourth linearly polarized wave CCW2.
Figure 8B:
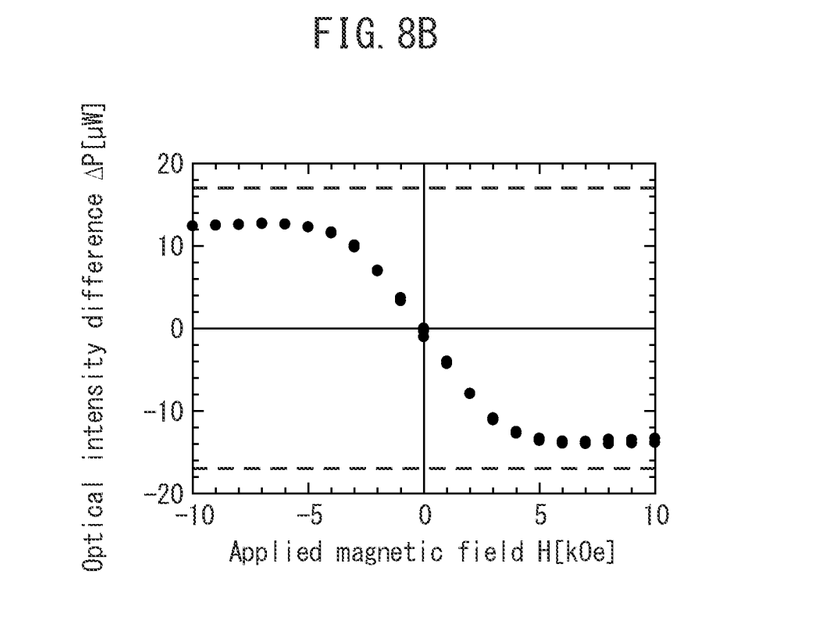
FIG. 8B is a diagram showing the relationship between a magnetic field applied to the Faraday rotator 52 and the difference between the optical intensities of the S and P polarization components of the multiplexing wave of the third linearly polarized wave CW2 and the fourth linearly polarized wave CCW2 shown in FIG. 8A.

FIG. 8A is a diagram showing an exemplary relationship between the magnetic field applied to the Faraday rotator 52 and the optical intensities of the S and P polarization components of the multiplexing wave of the third linearly polarized wave CW2 and the fourth linearly polarized wave CCW2. FIG. 8B is a diagram showing the relationship between a magnetic field applied to the Faraday rotator 52 and the difference between the optical intensities of the S and P polarization components of the multiplexing wave of the third linearly polarized wave CW2 and the fourth linearly polarized wave CCW2 shown in FIG. 8A. In FIGS. 8A and 8B, the horizontal axis shows a magnetic field applied to the Faraday rotator 52, in FIG. 8A, the vertical axis shows the optical intensities of the S polarization component and the P polarization component of the multiplexing wave of the third linearly polarized wave CW2 and the fourth linearly polarized wave CCW2. Further, in FIG. 8B, the vertical axis shows the difference between the optical intensities of the S and P polarized light components of the multiplexing wave of the third linearly polarized wave CW2 and the fourth linearly polarized wave CCW2 shown in FIG. 8A. In FIG. 8B, the rhombic mark indicates the S polarization component of the multiplexing wave of the third linearly polarized wave CW2 and the fourth linearly polarized wave CCW2, the square mark indicates the P polarization component of the multiplexing wave of the third linearly polarized wave CW2 and the fourth linearly polarized wave CCW2.

In the example shown in FIG. 8A, both the optical intensities of the S and P polarization components of the multiplexing wave of the third linearly polarized wave CW2 and the fourth linearly polarized wave CCW2 have the reference optical intensity of 243.7 μW shown by the broken line in FIG. 8A. As shown in FIG. 8B, the SN ratio of the detected signal corresponding to the detected magnetic field may be increased, since the reference optical intensity of 243.7 μW is removed from the difference between the optical intensities of the S and P polarization components of the multiplexing wave of the third linearly polarized wave CW2 and the fourth linearly polarized wave CCW2.

(Modification of the Interference Type Optical Magnetic Field Sensor Device According to the Embodiment)

Figure 9:
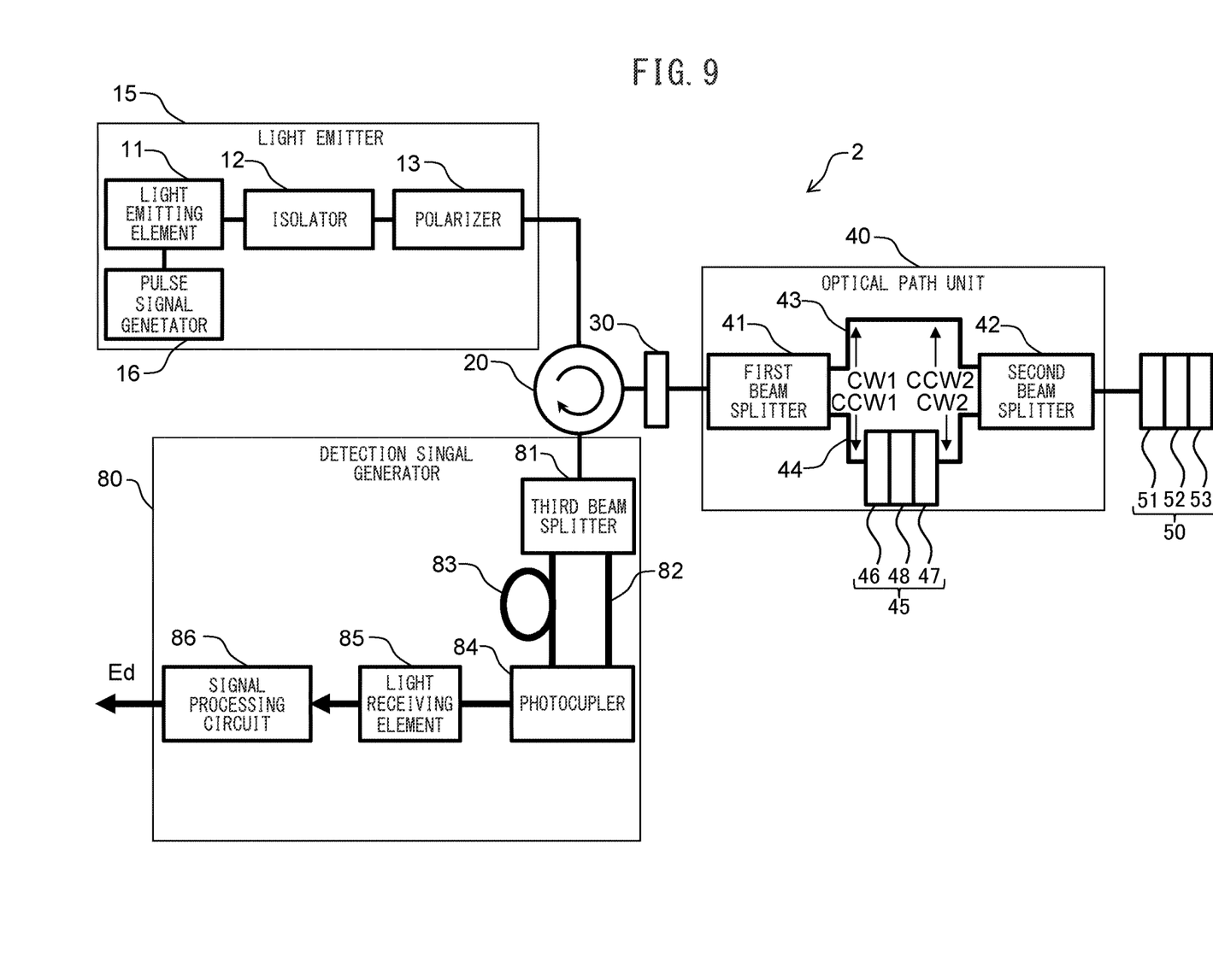
FIG. 9 is a block diagram showing a modification of the interference type optical magnetic field sensor device according to the embodiment.

FIG. 9 is a block diagram showing a modification of the interference type optical magnetic field sensor device according to the embodiment.

An interference type optical magnetic field sensor device 2 is different from the interference type optical magnetic field sensor device 1 that has a light emitter 15 and the detection signal generator 80 instead of the light emitter 10 and the detection signal generator 60. Since structures and functions of the interference type optical magnetic field sensor device 2 other than the light emitter 15 and the detection signal generator 80 is similar to those of components having the same reference numerals in the interference type optical magnetic field sensor device 1, a detailed description thereof will be omitted here.

The emitting unit 15 is different from the light emitter 10 that has a pulse signal generator 16. Since the structures and functions of the components of the light emitter 15 other than the pulse signal generator 16 are similar to those of the light emitter 10 having the same reference numerals, a detailed description thereof will be omitted here. The pulse signal generator 16 outputs a control signal for controlling the light emitting element 11 so that the light emitting element 11 emits light having a predetermined pulse width at a predetermined period to the light emitting element 11, based on an instruction of a signal processing unit (not shown).

The pulse signal emitted from the light emitting element 11 is polarized by the polarizer 13, and is emitted as a first linearly polarized light having a predetermined pulse width. The first linearly polarized light emitted from the polarizer 13 is incident on the detection signal generator 80 as a second linearly polarized light having a plus width corresponding to the pulse width of the first linearly polarized light, through the circulator 20, the first optical element 30, the optical path unit 40 and the magnetic field sensor element 50.

The detection signal generator 80 has a third beam splitter 81, a first optical path 82, a second optical path 83, a photocoupler 84, a light receiving element 85 and a signal processing circuit 86. The third beam splitter 81 is a prism type, a planar type, a polarizing beam splitter such as a wedge substrate type, an optical waveguide type (PBS) and etc. The third beam splitter 81 separates the second linearly polarized light branched by the circulator 20 into an S polarization component and a P polarization component having a plus width corresponding to the pulse width of the second linearly polarized light. The S polarization component separated by the third beam splitter 81 is introduced into the first optical path 82, the P polarization component separated by the third beam splitter 81 is introduced into the second optical path 83.

For example, the first optical path 82 and the second optical path 83 are polarization maintaining fiber such as PANDA fibers, and the optical path length is different from each other. The optical path lengths of the first optical path 82 and the second optical path 83 is defined so that the P polarization component introduced into the second optical path 83 is delayed from the S polarization component introduced into the first optical path 82 more than at least the pulse width of the S polarization component.

For example, the photocoupler 84 is a 3 dB coupler, multiplexes an S polarization component derived from the first optical path 82 and the P polarization component derived from the second optical path 83, and emits the multiplexed light to the light receiving element 85. For example, the light receiving element 85 is a PIN photodiode, receives the light multiplexed by photocoupler 84, photo-electrically converts the received light, and outputs an electrical signal corresponding to the amount of light of the received light.

The signal processing circuit 86 outputs a detection signal Ed corresponding to the detected magnetic field, by separating the electrical signal input from the light receiving element 85 into an electrical signal indicating the P and S polarization components, and differential amplifying the electrical signal indicating the P and S polarization components. For example, the signal processing circuit 86 separates the electrical signal into electrical signals indicating the S and P polarization components, based on a control signal outputs to the light emitting element 11 by the pulse signal generator 16, and the timing for the S and P polarization components incident on the photocoupler 84. Further, the signal processing circuit 86 differential amplifies the electrical signal indicating the S and P polarization components, for example, by a differential amplifier circuit formed by an operational amplifier and etc.

What is claimed is:

1. An interference type optical magnetic field sensor device comprising:
    a light emitter emitting first linearly polarized light;
    a first optical element receiving the first linearly polarized light, and forming polarized-plane-rotated light including a first linearly polarized wave and a second linearly polarized wave orthogonal to the first linearly polarized wave, from the received first linearly polarized light by rotating a polarized plane of the first linearly polarized light and outputting the polarized-plane-rotated light;
    a first beam splitter receiving the polarized-plane-rotated light;
    a first optical path connected to the first beam splitter;
    a second optical path connected to the first beam splitter;
    a second beam splitter connected to the first optical path and the second optical path;
    a magnetic field sensor element to be disposed within a magnetic field, which is connected to the second beam splitter, wherein a Faraday rotation angle is shifted in response to the magnetic field applied to the magnetic field sensor element; and
    a detection signal generator outputting a detection signal,
    wherein the first optical element forms the polarized-plane-rotated light from the first linearly polarized light emitted from the light emitter, and outputs the polarized-plane-rotated light to the first beam splitter,
    the first beam splitter receives the polarized-plane-rotated light, and separates the received polarized-plane-rotated light into the first linearly polarized wave and the second linearly polarized wave, transmits the first linearly polarized wave to the first optical path so that the first linearly polarized wave propagates in the first optical path, and transmits the second linearly polarized wave to the second optical path so that the second linearly polarized wave propagates in the second optical path,
    the second beam splitter receives the first linearly polarized wave and the second linearly polarized wave, and transmits the first linearly polarized wave and the second linearly polarized wave, to the magnetic field sensor element,
    the magnetic field sensor element receives the first linearly polarized wave and the second linearly polarized wave, in which a Faraday rotation angle of the received first linearly polarized wave is shifted by the magnetic field applied to the magnetic field sensor thereby forming a third linearly polarized wave, and a Faraday rotation angle of the received second linearly polarized wave is shifted by the magnetic field applied to the magnetic field sensor thereby forming a fourth linearly polarized wave, and outputs the third linearly polarized wave and the fourth polarized wave to the second beam splitter, the second beam splitter receiving the third linearly polarized wave and the fourth linearly polarized wave and transmits the third linearly polarized wave to the second optical path so that the third linearly polarized wave propagates in the second optical path and transmits the fourth linearly polarized wave to the first optical path so that the fourth linearly polarized wave propagates in the first optical path, the first beam splitter receives the third linearly polarized wave and the fourth linearly polarized wave, forms a multiplexing wave from the third linearly polarized wave and the fourth linearly polarized wave and transmits the multiplexing wave to the first optical element, the first optical element receives the multiplexing wave from the first beam splitter, and forms a second linearly polarized light from the multiplexing wave, and outputs the second linearly polarized light to the detection signal generator, and the detection signal generator receives the second linearly polarized light and outputs the detection signal formed by separating the received second linearly polarized light into an S polarization component and a P polarization component, and converting the S polarization component and the P polarization component into an electric signal.

2. The interference type optical magnetic field sensor device according to claim 1, further including a second optical element, which adjusts the phases of the second linearly polarized wave and the third linearly polarized wave so that the phase difference between the second linearly polarized wave and the third linearly polarized wave is 90 degrees.

3. The interference type optical magnetic field sensor device according to claim 1, wherein the first optical element is a (½) wave plate disposed so as to have azimuth of 22.5 degrees respect to the polarization plane of the first linearly polarized light incident from the light emitter.

4. The interference type optical magnetic field sensor device according to claim 1, wherein optical paths among the light emitter, the first optical element the first optical path, the second optical path, the magnetic field sensor element and the detection signal generator are connected by polarization maintaining fibers.

5. The interference type optical magnetic field sensor device according to claim 4, wherein each of the polarization maintaining fibers is a PANDA fiber.

* * * * *